United States Patent [19]
Lee

[11] Patent Number: 5,779,061
[45] Date of Patent: Jul. 14, 1998

[54] SHELF FRAME FOR USE IN A RACK FOR STORING A COMMUNICATION SYSTEM

[75] Inventor: Gab-Sang Lee, Incheon, Rep. of Korea

[73] Assignee: Daewoo Telecom Ltd., Rep. of Korea

[21] Appl. No.: 744,491

[22] Filed: Nov. 6, 1996

[30] Foreign Application Priority Data

Nov. 7, 1995 [KR] Rep. of Korea ............... 1995 32527

[51] Int. Cl.[6] ........................................... A47F 7/00
[52] U.S. Cl. ................................. 211/26; 211/41.17
[58] Field of Search ..................... 211/40, 41.1, 41.12, 211/41.11, 41.17, 41.18, 26; 361/796, 798, 801, 728, 729

[56] References Cited

U.S. PATENT DOCUMENTS

| | | | |
|---|---|---|---|
| 4,580,192 | 4/1986 | Baun | 211/41.17 X |
| 4,996,631 | 2/1991 | Freehauf | 211/41.17 X |
| 5,293,303 | 3/1994 | Fletcher et al. | 211/41.17 X |
| 5,317,482 | 5/1994 | Bujtas | 211/41.17 X |
| 5,402,319 | 3/1995 | Shumaker et al. | 211/41.17 X |
| 5,406,455 | 4/1995 | Devenish, III | 211/41.17 X |

Primary Examiner—Jose V. Chen
Attorney, Agent, or Firm—Pennie & Edmonds LLP

[57] ABSTRACT

A shelf frame for use in a rack for storing a communication system is provided with a first locking portion for locking a first front plate extending along one side of the frame, a second locking portion for locking a second front plate and opened outwardly and located behind and below and running parallel to the first locking portion, an ejector supporting portion opened downwardly and located behind and running parallel to the second locking portion, and for rotatably supporting a support portion of an ejector, and a clamping portion for clamping a guide rail located and extending along the opposite side thereof, thereby effectively shielding electromagnetic waves.

15 Claims, 5 Drawing Sheets

SHELF FRAME FOR USE IN A RACK FOR STORING A COMMUNICATION SYSTEM

FIELD OF THE INVENTION

The present invention relates to a shelf frame for use in a rack for storing a communication system; and, more particularly, to a shelf frame capable of effectively shielding electromagnetic waves.

DESCRIPTION OF THE PRIOR ART

As is well known, a rack for storing a communication system consists of a plurality of shelves, each of the shelves being capable of accommodating a number of units constructing the system, each of units being disposed with a number of electronic parts.

There is shown in FIG. 1 a typical shelf 10 comprising four frames 20 transversely disposed on top and bottom of a front portion and a rear portion thereof, respectively, a pair of side plates 2 fixed to a right and a left ends of each of the frames 20, and a back plate 4 disposed on the rear portion of the shelf 10 to thereby form a hexahedron.

A number of units constructing the communication system are detachably inserted into the shelf 10, each of the units being separated from each other at a regular interval. The unit normally includes a printed circuit board 12, a front plate 16, and a unit connector 8 connected to a connector 6 disposed on the back plate 4. A gap 18 is formed between the front plates 16. If desired, the unit further includes an ejector(not shown) mounted to top and bottom of the front plate 16 in order to easily connect the unit connector 8 with the connector 6.

On the other hand, as shown in FIG. 2, the frame 20 includes a locking portion 21 for locking the front plate 16 at one end thereof, and a clamping portion 23 for clamping a guide rail 14 at the other end thereof. The locking portion 21 includes a first groove 24 formed horizontally and a second groove 28 vertically formed with respect to the first groove 24. A bar 26 having a screw hole is inserted into the second groove 28. The clamping portion 23 includes a guide rail fixing groove 29 having a pair of jaws 27 symmetrically arranged at the top and bottom thereof, respectively, and a plurality of through holes 25 regularly spaced horizontally in the middle thereof. Further, the guide rail 14 includes a clamping member 15 having a hook 17 and a pair of supports 19 disposed adjacent to the hook 17 to thereby guide the printed circuit board 12 therealong. The hook 17 is inserted into the through hole 25 of the guide rail fixing groove 29 and the supports 19 are clamped to the jaws 27, respectively. A screw 22 is fastened through the front plate 16 to the bar 26 to thereby fix the front plate 16. A reference number 40 in FIG. 2 refers to a means for combining the front plate 16 with the printed circuit board 12.

In general, various electromagnetic waves are radiated during the operation of the communication systems, including electromagnetic waves which cause electromagnetic interference("EMI"). One of the major shortcomings of the conventional shelf as described above is that the shelf is incapable of shielding the electronic waves within the shelf as a result of the presence of the gap 18 between the front plates 16 of the units.

SUMMARY OF THE INVENTION

It is, therefore, a primary object of the invention to provide a shelf frame for use in a rack for storing a communication system, which is capable of effectively shielding electromagnetic waves.

The above and other objects of the present invention are accomplished by providing a shelf frame for use in a rack for storing a communication system, the shelf frame comprising:

a first locking portion for locking a first front plate extending along one side of the frame;

a second locking portion for locking a second front plate and opened outwardly and located behind and below and running parallel to the first locking portion;

an ejector supporting portion opened downwardly end located behind the second locking portion and running parallel to the second locking portion, and for rotatably supporting a support portion of an ejector; and a clamping portion for clamping a guide rail located and extending along the opposite side thereof.

BRIEF DESCRIPTION OF THE DRAWINGS

The above and other objects, features and advantages of the present invention will become apparent from the following detailed description, when taken in conjunction with the accompanying drawings, in which.

DETAILED DESCRIPTION OF THE PREFERRED EMBODIMENTS

Figure 3:
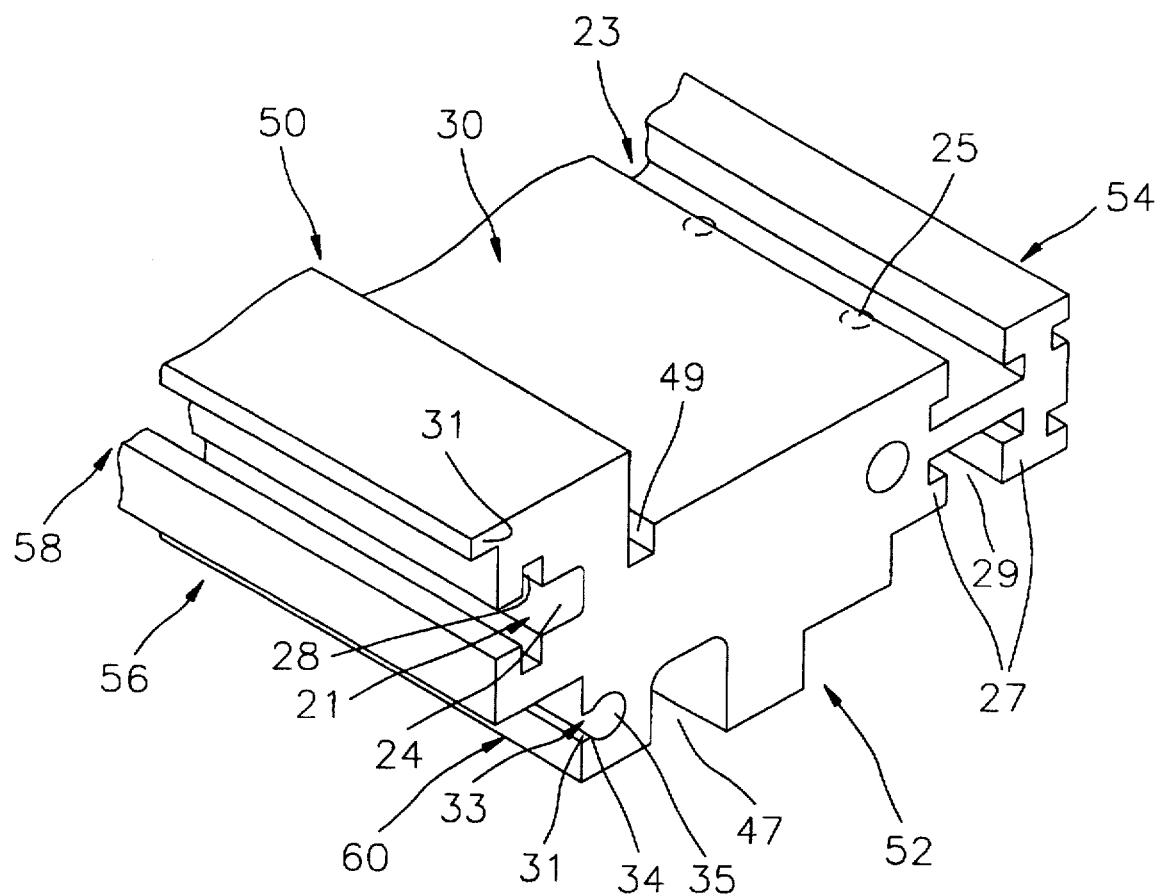
FIG. 3 provides a perspective view of a shelf frame for use in a rack for storing a communication system in accordance with the preferred embodiment of the present invention.

Referring now to FIG. 3, there is shown an inventive shelf frame in accordance with a preferred embodiment of the invention. The shelf frame 30 has a top side 50, a bottom side 52, a rear side 54 and a front side 56. The shelf frame 30 also includes a first locking portion 21 extending along a protruding portion 58 of the front side of the frame, a second locking portion 33 opened outwardly and located behind and below and running parallel to the first locking portion 21, the second locking portion being formed on and extending along a recessed portion 60 of the front side of the frame, an ejector supporting portion 47 opened downwardly and located behind and running parallel to the second locking portion 33, and a clamping portion 23 located and extending along the opposite side thereof.

Figure 2:
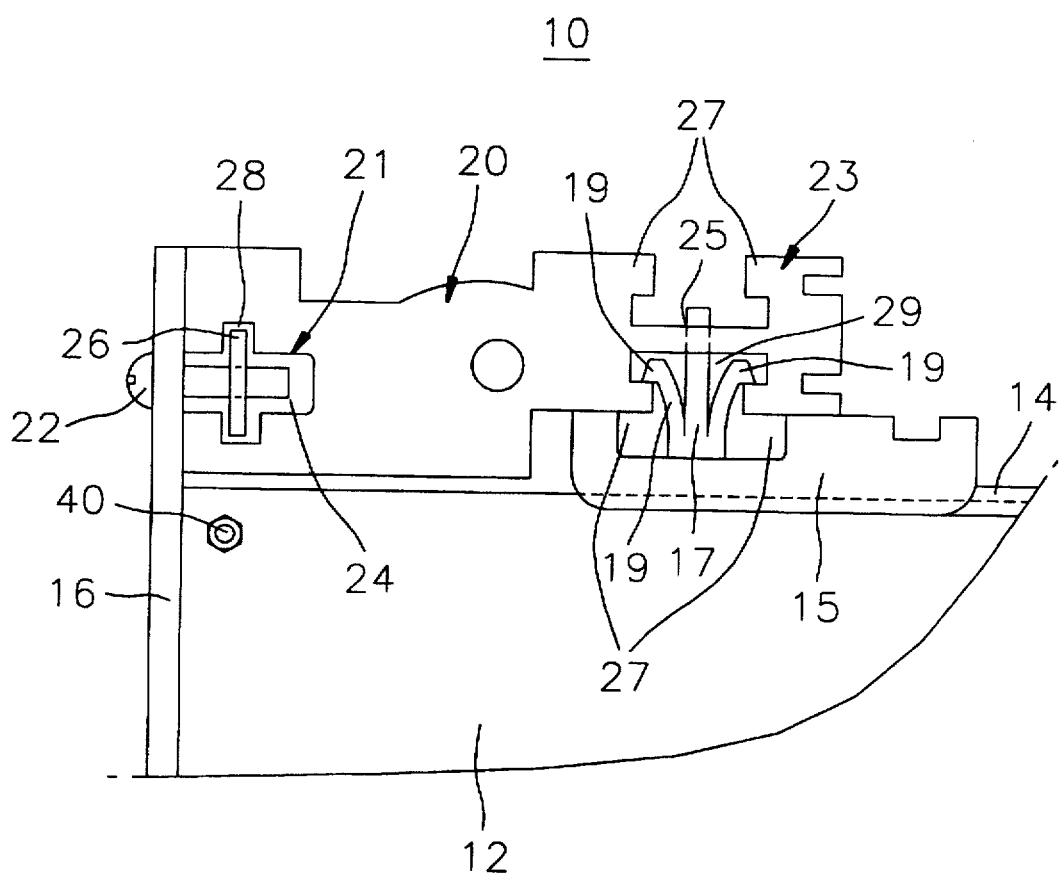
FIG. 2 represents a sectional view showing how a conventional shelf frame is combined with parts constructing the shelf.
Figure 4:
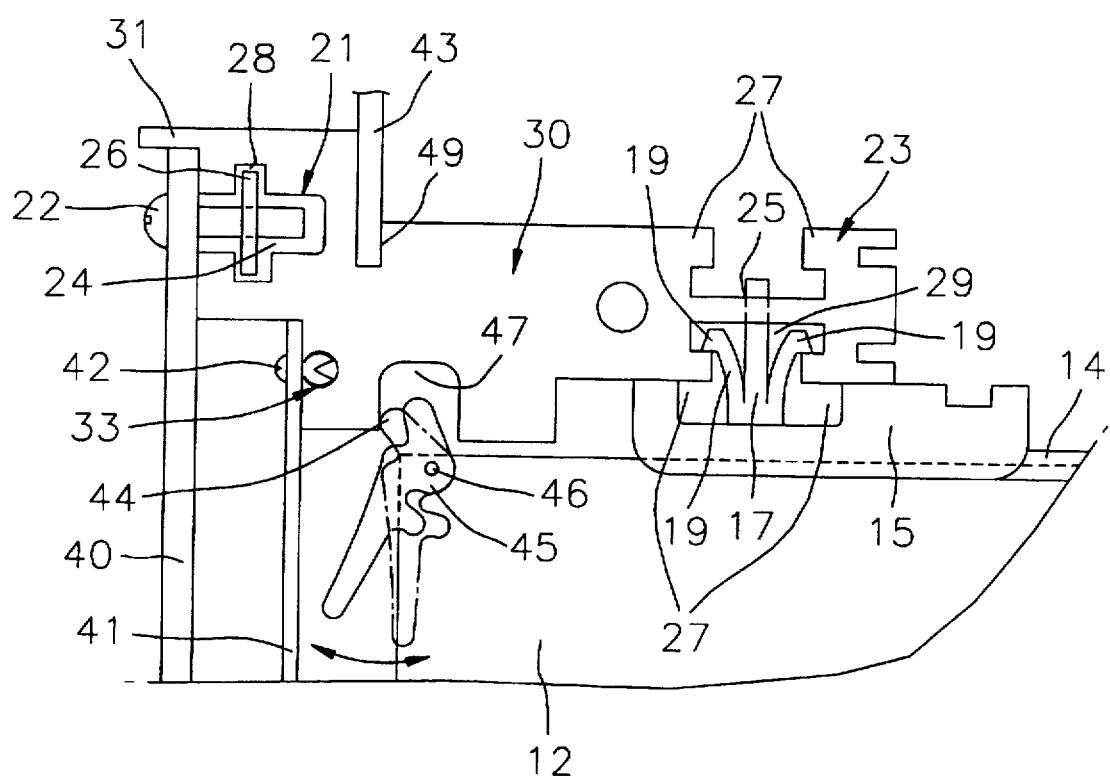
FIG. 4 describes a sectional view showing how an inventive shelf frame is combined with parts constructing a shelf.

The construction of the first locking portion 21 is similar to that of the conventional frame of FIG. 2 except that an upper portion thereof is provided with a protrusion 31 which is in contact with the upper portion of the first front plate 40 as shown in FIG. 4. Further, the clamping portion 23 has the same construction of the clamping portion depicted in FIG. 2. Accordingly, the construction of the first locking portion 21 and the clamping portion 23 will not be further discussed herein for the sake of economy.

Figure 5:
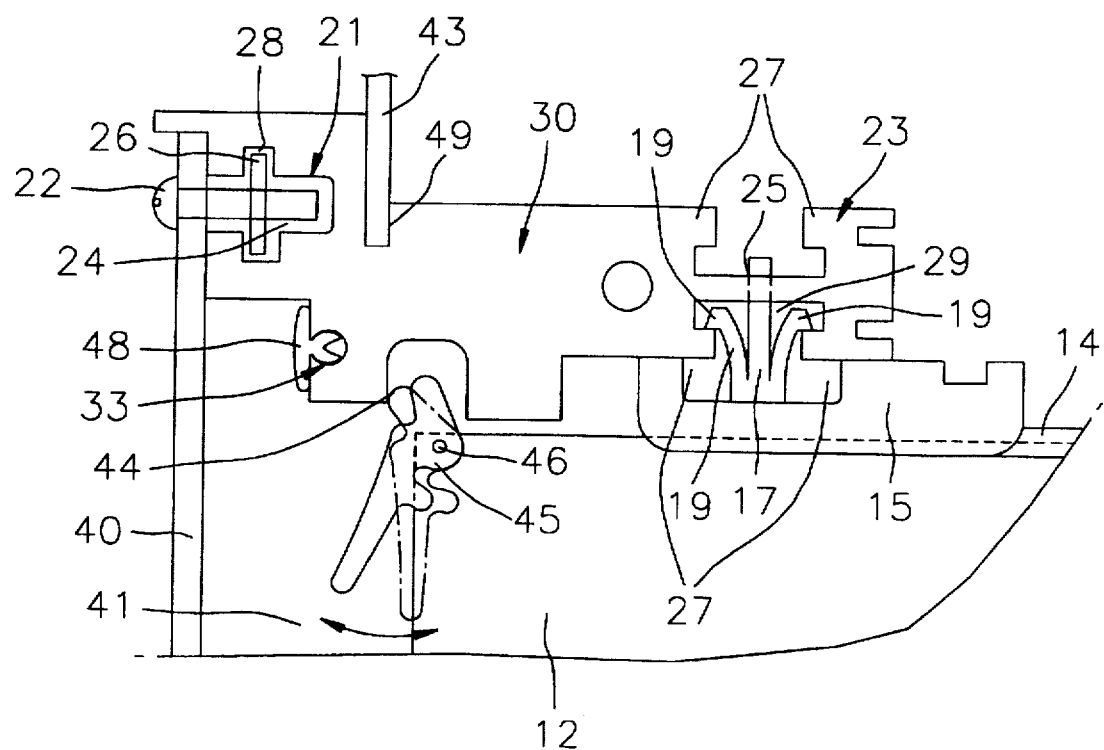
FIG. 5 offers a sectional view of a shelf frame for use in a rack for storing communication system in accordance with another embodiment of the present invention.

The second locking portion 33 includes a rectangular groove 31 and a circular groove 35. The circular groove 35 is larger than the rectangular groove 31, thereby forming a locking jaw 34 on the portion meeting the rectangular and circular grooves 31 and 35, allowing the second front plate 41 to be easily locked by a locking means 42 to the second locking portion 33 as depicted in FIGS. 4 and 5. Further, it is preferable that the size of the first and the second front plates 40 and 41 may be large enough to shield whole front of the shelf frame 30.

Since the second locking portion 33 is located behind and below the first locking portion 21, there is maintained a space between the plates 40 and 41, thereby allowing top of the second front plate 41 to be in contact with bottom of the first locking portion 21.

As shown in FIG. 4, a tip end of the locking means 42 is preferred to be divided into and biased outwardly, thereby locking with the locking jaw 34 of the second locking portion 33.

On the other hand, a support portion 44 of an ejector 45 is inserted into the ejector supporting portion 47 as shown in FIG. 4. It is preferable that an upper portion of the ejector supporting portion 47 has a substantially semi-circular rounded portion in order to allow the support portion 44 to smoothly rotate about a hinge axis 46.

Further, the shelf frame 30 in accordance with the present invention is provided with a baffle clamping groove 49 for clamping a baffle 43 and opened upwardly at the back of the first locking portion 21 and between the second locking portion 33 and the ejector supporting portion 47.

Figure 1:
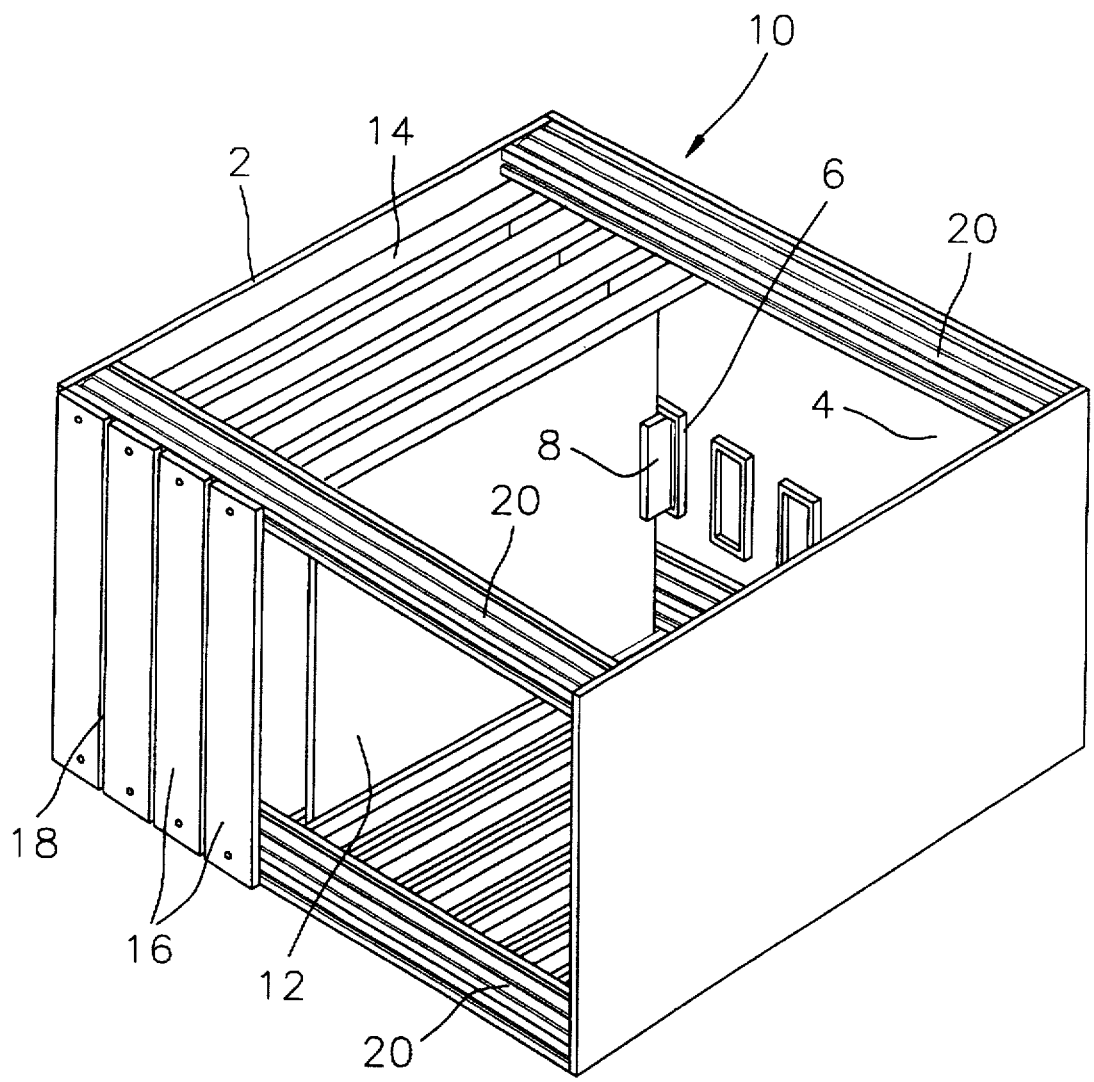
FIG. 1 shows a schematic view of a conventional shelf.

When the ejector 45 is rotated counterclockwise, the printed circuit board 12 is slid backward, thereby connecting the unit connector 8 of the printed circuit board 12 with the connector 6(FIG. 1) and the rotation of the ejector 45 is restricted by a front side wall of the ejector supporting portion 47.

On the contrary, when the ejector 45 is rotated clockwise, the printed circuit board 12 is drawn forward, thereby releasing the unit connector 8 of the printed circuit board 12 from the connector 6(FIG. 1) and the rotation of the ejector 45 is restricted by a rear side wall of the ejector supporting portion 47.

In FIG. 5, a place card 48 having a fixing pin integrally formed in back surface thereof, instead of the second front plate 41 and the locking means 42, is inserted into the second locking portion 33, thereby forming a printing surface in front surface of the place card 48 as well as shielding electromagnetic waves.

Although the invention has been shown and described with respect to the preferred embodiments, it will be understood by those skilled in the art that certain changes and modifications may be made without departing from the spirit and scope of the invention as defined in the following claims.

What is claimed is:

1. A shelf frame for use in a rack for storing a communication system, the shelf frame comprising:

a top side, a bottom side, a rear side and a front side, said front side comprising a protruding portion proximate said top side and a recessed portion proximate said bottom side, said recessed portion being rearwards of said protruding portion in a side view of the shelf frame;

a first locking portion extending along said protruding portion;

a second locking portion extending along said recessed portion and running parallel to the first locking portion;

an ejector supporting portion formed in said bottom side and running parallel to the second locking portion; and a clamping portion located and extending along said rear side.

2. The shelf frame according to claim 1, further including a baffle clamping groove formed in the top side of the frame, said baffle clamping groove being located rearwards of said first and second locking portions, and frontwards of the ejector supporting portion, in a side view of the shelf frame.

3. The shelf frame according to claim 1, wherein the second locking portion includes a rectangular groove and a circular groove which is larger than the rectangular groove, and a locking jaw formed on the portion meeting the rectangular and circular grooves.

4. The shelf frame according to claim 1, wherein an upper portion of the ejector supporting portion has a substantially semi-circular rounded portion.

5. A shelf frame for use in a rack for storing a communication system, the shelf frame comprising:

a first locking portion for locking a first front plate, the first locking portion being formed on and extending along a protruding portion of a front side of the frame;

a second locking portion for locking a second front plate, the second locking portion being formed on, and extending along, a recessed portion of the front side of the frame, the second locking portion running parallel to the first locking portion;

an ejector supporting portion for rotatably supporting a support portion of an ejector, the ejector supporting portion being formed on a bottom side of the frame and running parallel to the second locking portion; and a clamping portion for clamping a plurality of guide rails, the clamping portion being formed adjacent to a rear side of the frame.

6. The shelf frame according to claim 5, further comprising a baffle clamping groove for clamping a baffle, the baffle clamping groove being formed on a top side of the frame and located between the second locking portion and the ejector supporting portion, in a side view of the shelf frame.

7. The shelf frame according to claim 5, wherein the second locking portion includes a rectangular groove, a circular groove larger than the rectangular groove, and a locking jaw formed on a portion meeting the rectangular and the circular grooves.

8. The shelf frame according to claim 7, wherein said second locking portion is shaped to accept a locking means fitted through a second front plate and into and into the circular groove.

9. The shelf frame according to claim 8, wherein said locking means has a tip divided into two outwardly biased parts.

10. A rack for storing a communication system, said rack comprising, in combination:

a shelf frame comprising:

a top side, a bottom side, a rear side and a front side, said front side comprising a protruding portion proximate said top side and a recessed portion proximate said bottom side, said recessed portion being rearwards of said protruding portion in a side view of the shelf frame;

a first locking portion extending along said protruding portion.

a second locking portion extending along said recessed portion and running parallel to the first locking portion;

an ejector supporting portion formed in said bottom side and running parallel to the second locking portion; and a clamping portion located and extending along said rear side;

a first front plate secured to said first locking portion; and a second front plate secured to said second locking portion.

11. The rack of claim 10, wherein said first and second plates are spaced apart from one another, in a side view of the shelf frame.

12. The rack of claim 10, wherein the second locking portion includes a rectangular groove and a circular groove which is larger than the rectangular groove, and a locking jaw formed on the portion meeting the rectangular and circular grooves.

13. The rack of claim 12, wherein said second front plate is secured to said second locking portion by a locking means fitted through said second front plate and into said circular groove.

14. The rack of claim 10, wherein said shelf frame further comprises a baffle clamping groove formed in the top side of the frame, said baffle clamping groove being located rearwards of said first and second locking portions, and frontwards of the ejector supporting portion, in a side view of the shelf frame.

15. The rack of claim 10, wherein said ejector supporting portion has a substantially semi-circular rounded portion shaped and sized to accommodate a rotation of a support portion of an ejector which is attached to a printed circuit board inserted into said rack.

* * * * *